United States Patent [19]

Mondor et al.

[11] Patent Number: 4,728,160
[45] Date of Patent: Mar. 1, 1988

[54] CABINET FOR A COMPUTER ASSEMBLY

[75] Inventors: Robert M. Mondor, Sutton; Mark Howards, Belmont; Charles R. Barker, III, Harvard; Alan R. Selling, Franklin, all of Mass.

[73] Assignee: Digital Equipment Corporation, Maynard, Mass.

[21] Appl. No.: 922,095

[22] Filed: Oct. 22, 1986

[51] Int. Cl.[4] ............................................. A47B 77/08
[52] U.S. Cl. ............................. 312/236; 312/257 A; 361/384
[58] Field of Search ............ 312/236, 257 A, 257 SM, 312/319, 320; 62/259.2; 361/384, 390

[56] References Cited

U.S. PATENT DOCUMENTS

| | | | |
|---|---|---|---|
| 502,237 | 7/1893 | Proctor | 312/236 |
| 2,115,720 | 5/1938 | Holmes | 312/236 |
| 2,480,568 | 8/1949 | Garvin | 312/257 A |
| 2,566,064 | 8/1951 | Keim | 312/320 |
| 3,146,047 | 8/1964 | Mayon et al. | 312/319 |
| 3,366,432 | 1/1968 | Carmer | 312/236 |
| 3,467,892 | 9/1969 | Sprude et al. | 361/384 |
| 3,691,432 | 9/1972 | Edfors et al. | 361/384 |
| 4,515,143 | 5/1985 | Jabas | 312/236 |
| 4,589,712 | 5/1986 | Hastings | 312/236 |
| 4,621,876 | 11/1986 | Reimer | 312/320 |

FOREIGN PATENT DOCUMENTS 632795 12/1961 Canada ............................ 312/236

Primary Examiner—Victor N. Sakran
Attorney, Agent, or Firm—Cesari & McKenna

[57] ABSTRACT

The present invention comprises a computer system housing embodying the invention incorporates a frame upon which the components of the computer system are mounted. The frame has a base, a main unit secured to the frame, and a front compartment, for mounting mass storage unit therein, swingably positioned on the main unit. A housing adapted for supporting a central processor unit and a power supply of the computer system is removable disposed in the main unit. The frame and the housing are provided with all pneumatic connections so that air for cooling various components of the computer system may be brought over such components by the action of a fan mounted on the base. Thus, internally generated heat in such components can be readily dissipated by the air flow over such components. The frame and the housing are adapted so that the components of the computer system positioned therein are accessible with relative ease so that they are installed, replaced, and repaired easily.

45 Claims, 10 Drawing Figures

CABINET FOR A COMPUTER ASSEMBLY

This invention relates to a cabinet for a computer assembly and more particularly to a cabinet for a digital computer, that occupies a minimum space, and yet promotes ease of installation, maintenance and replacement of the assembly's components.

BACKGROUND OF THE INVENTION

The physical size of digital computer systems has been the subject of a substantial development effort for a number of years. The space occupied by such computer systems has decreased markedly, as a result of a dramatic reduction in the size and power dissipation of the various components that make up the system. In particular, the large-scale integration of central processor units and memory units and the reduction in size of disk sub-systems have materially reduced the aggregate physical volume of the units that make up the overall system.

Even so, the "packaging" of these units in a minimum physical volume remains a challenge to the designers of these systems. As the volume decreases, one encounters increased difficulties and expenses in maintenance and repair due to the limited space and greater concentration of components within such systems. Further, the extraction of internally generated heat becomes more difficult, a significant problem in view of the relatively low temperatures that must be maintained for reliable performance of the various sub-units of such computer systems. The temperature problem is aggravated by the fact that one reason for small sizes is to acquire more freedom in the location of computer systems in general and, in particular, to be free to place them in areas that do not have special climate-control facilities. Also, the placement of such computer systems in office and other such environments require that the system be substantially quiet.

SUMMARY OF THE INVENTION

It is therefore an object of the invention to provide an improved cabinet structure for housing a computer system in a relatively small physical volume.

Another object is to provide an improved cabinet structure for a computer system in which the sub-systems of the computer system can be easily installed, replaced, or repaired.

Another object is to provide a cabinet structure with improved air flow characteristics which provide ample cooling of various components of the computer system without being restricted to an area having special climate-control facilities.

A further object is to provide a cabinet structure which provides ample cooling of various components of the computer system even when the cabinet structure is in a relatively confined space.

The present invention accordingly comprises the features of construction combinations of elements, and arrangement of parts which will be exemplified in the construction hereinafter set forth, and the scope of the invention will be indicated in the claims.

A computer system housing embodying the invention incorporates a frame upon which the components of the computer system are mounted. The frame has a base, a main unit secured to the frame, and a front compartment swingably positioned on the main unit. A housing adapted for supporting a central processor unit and a power supply of the computer system is removable disposed in the main unit. The frame and the housing are provided with all pneumatic connections so that air for cooling various components of the computer system may be brought over such components by the action of a fan mounted on the base. Thus, internally generated heat in such components can be readily dissipated by the air flow over such components. The frame and the housing are adapted so that the components of the computer system positioned therein are accessible with relative ease so that they are installed, replaced, and repaired easily.

BRIEF DESCRIPTION OF THE DRAWINGS

For a fuller understanding of the nature and objects of the invention, reference should be had to the following detailed description taken in connection with the accompanying drawings in which:

FIG. 3A is a cut-away view of a unit of the inner structure;

FIG. 3B is a cut-away view of another unit of the inner structure;

DETAILED DESCRIPTION OF THE PREFERRED EMBODIMENTS

Figure 1:
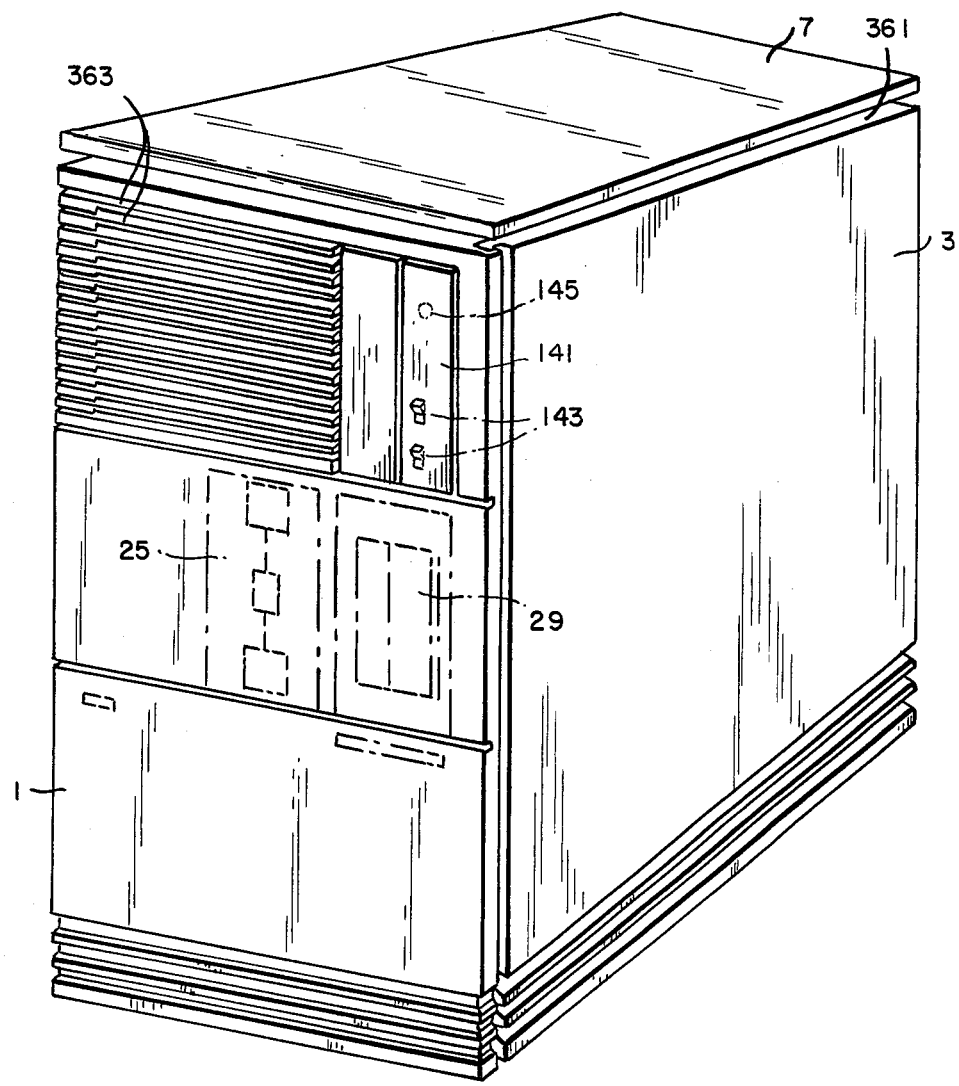
FIG. 1 is a front perspective view of a cabinet embodying the invention.
Figure 2:
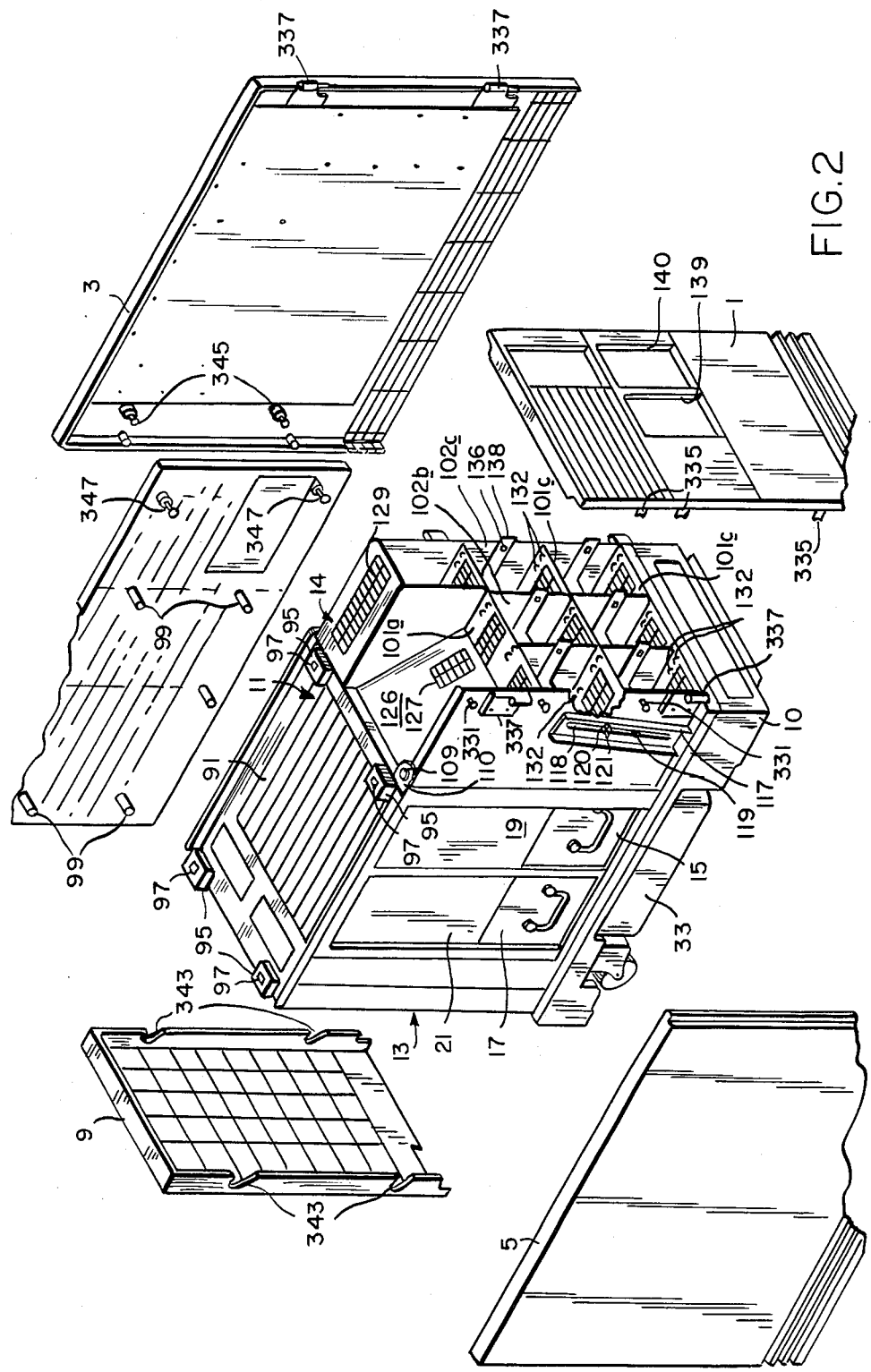
FIG. 2 is an exploded perspective view of the cabinet of FIG. 1 from a different vantage point.

Referring now to FIGS. 1 and 2 a cabinet housing a data processor system is enclosed by a front panel 1, a left and a right side panel 3 and 5, respectively, a top panel 7, and a rear panel 9.

Figure 3:
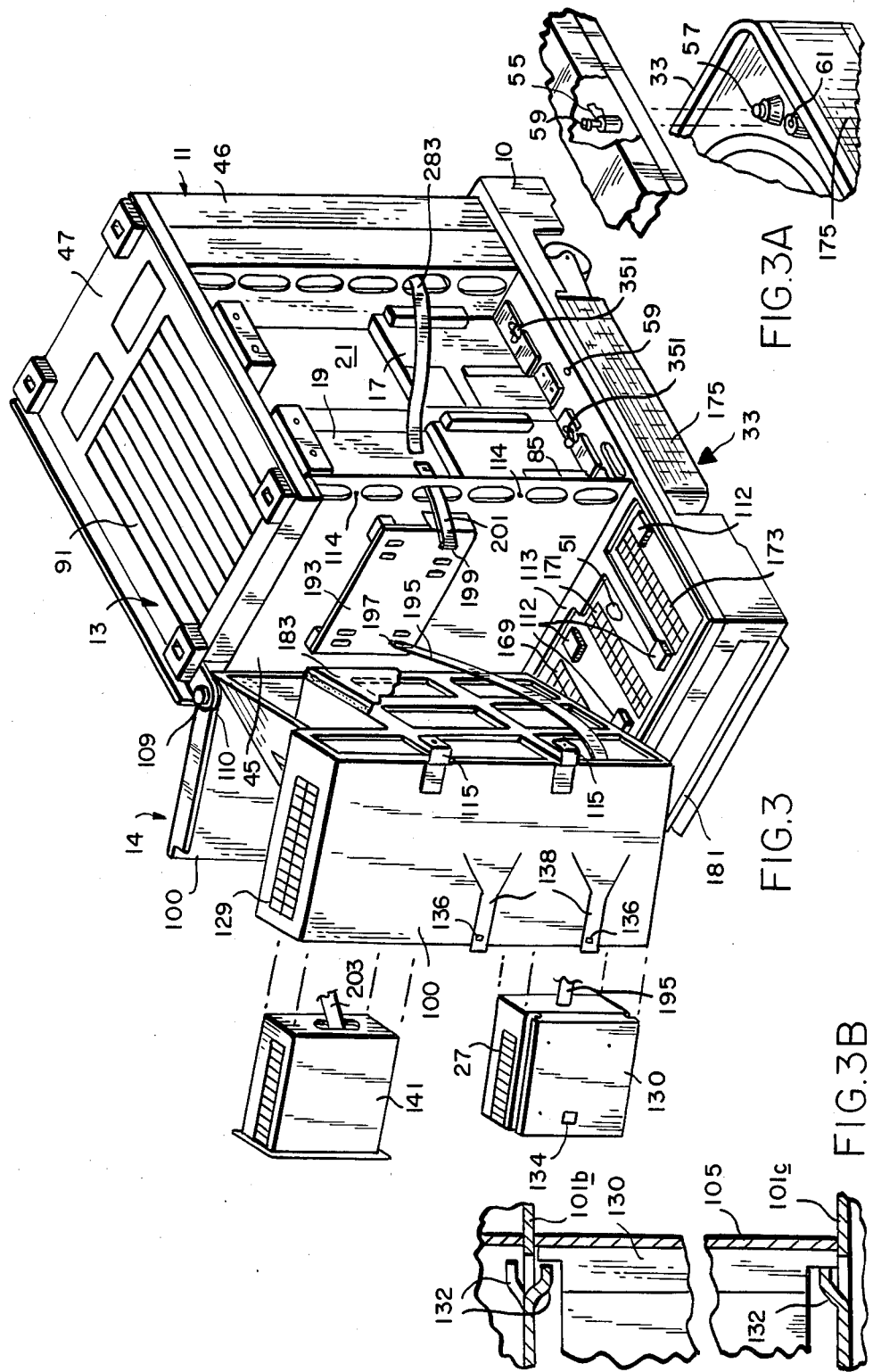
FIG. 3 is an exploded perspective view of the inner structure of the cabinet, showing the various units of a computer assembly housed therein.
Figure 4:
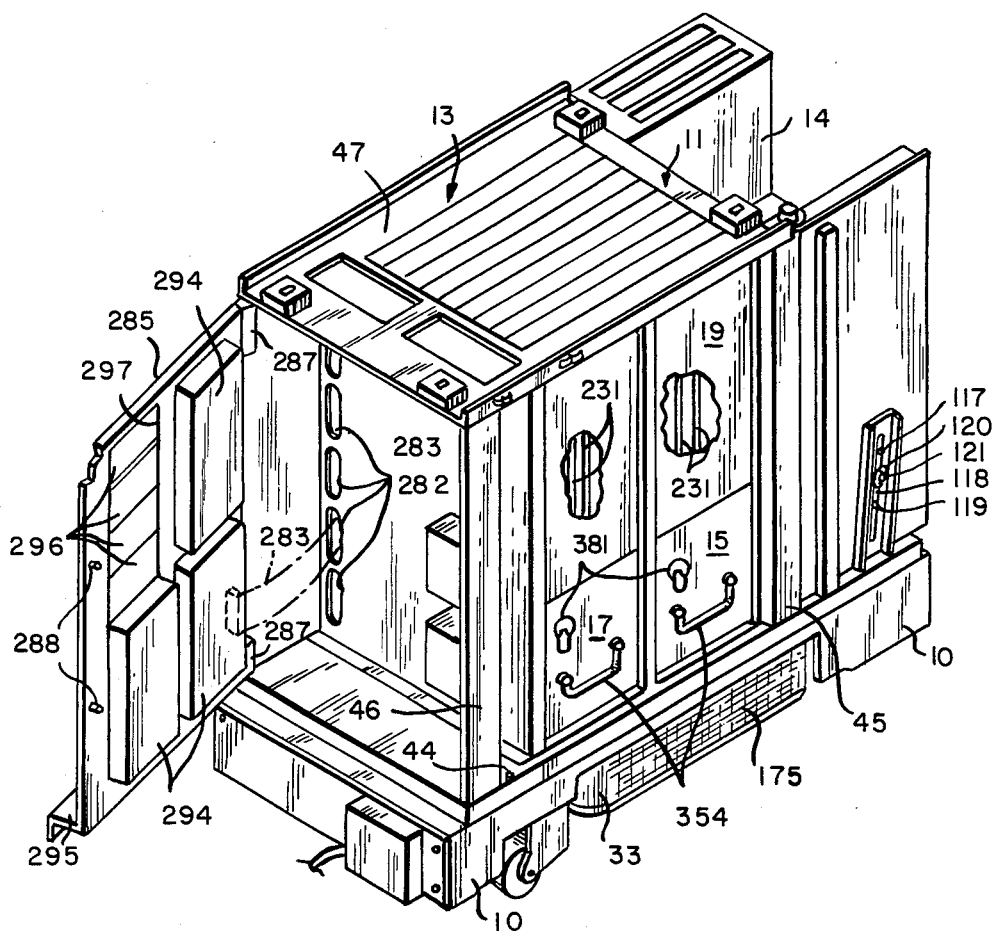
FIG. 4 is a rear perspective view of the inner structure shown in FIG. 3.

In FIGS. 2, 3 and 4, the computer assembly of FIG. 1 is shown with the panels 1–9 removed. A base 10 supports a frame generally indicated at 11. The frame includes a main stuctural unit 13 and a front unit 14 swingably attached to the main unit 13. A variety of computer subassemblies are removably positioned on the frame 11.

Specifically, power supplies 15 and 17 are removably positioned in the main unit 13 at the bottom thereof; central processor units 19 and 21 are positioned above the power supplies 15 and 17, respectively. A mass storage device such as a floppy disk drive 25 (FIG. 1), a fixed disk drive 27 (FIG. 3), and a tape drive 29 (FIG. 1) are removably positioned in the front unit 14. It will be understood that such mass storage devices may be deployed in the front unit 14 in various combinations.

The mass storage devices are interconnected to the central processor units 19 and 21 via electrical cables and connectors in a known manner. The power supplies 15 and 17, which supply power to the mass storage devices and the central processor units, receive power, in turn, from an outside source, such as a standard wall outlet in a known manner.

With reference to FIGS. 1 and 2, as described in further detail below, air paths are arranged such that air to cool the equipment may pass between and through the panels 1, 3, 5, 7 and 9 to the frame 11. The air then passes through and over the mass storage devices, the central processor units 19 and 21, and the power supplies 15 and 17. A fan 33, positioned on the base 10, pulls air along these air paths and then expels it at the bottom of the cabinet.

Thus, as more fully explained below, the cabinet of the present invention provides a computer assembly that is compact and yet readily serviceable. The cabinet construction also provides for ease of assembly of both the cabinet itself and the system housed therein. Furthermore, the various modular units of the enclosed system may be easily replaced and installed without disturbing other major units in the assembly. The cabinet also permits the cooling of various components of the assembly, even within confined spaces.

Figure 5:
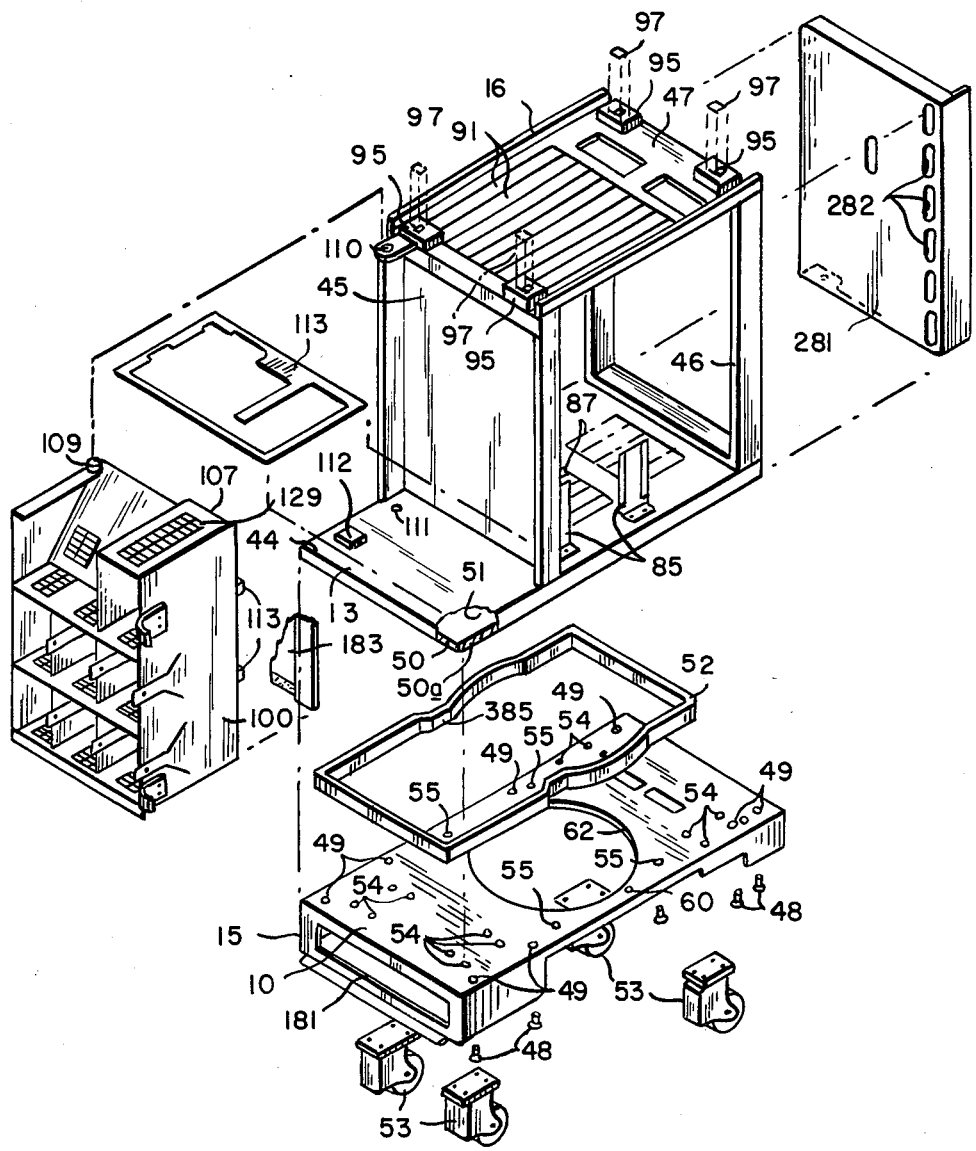
FIG. 5 is an exploded view of the inner structure of the housing.
Figure 5A:
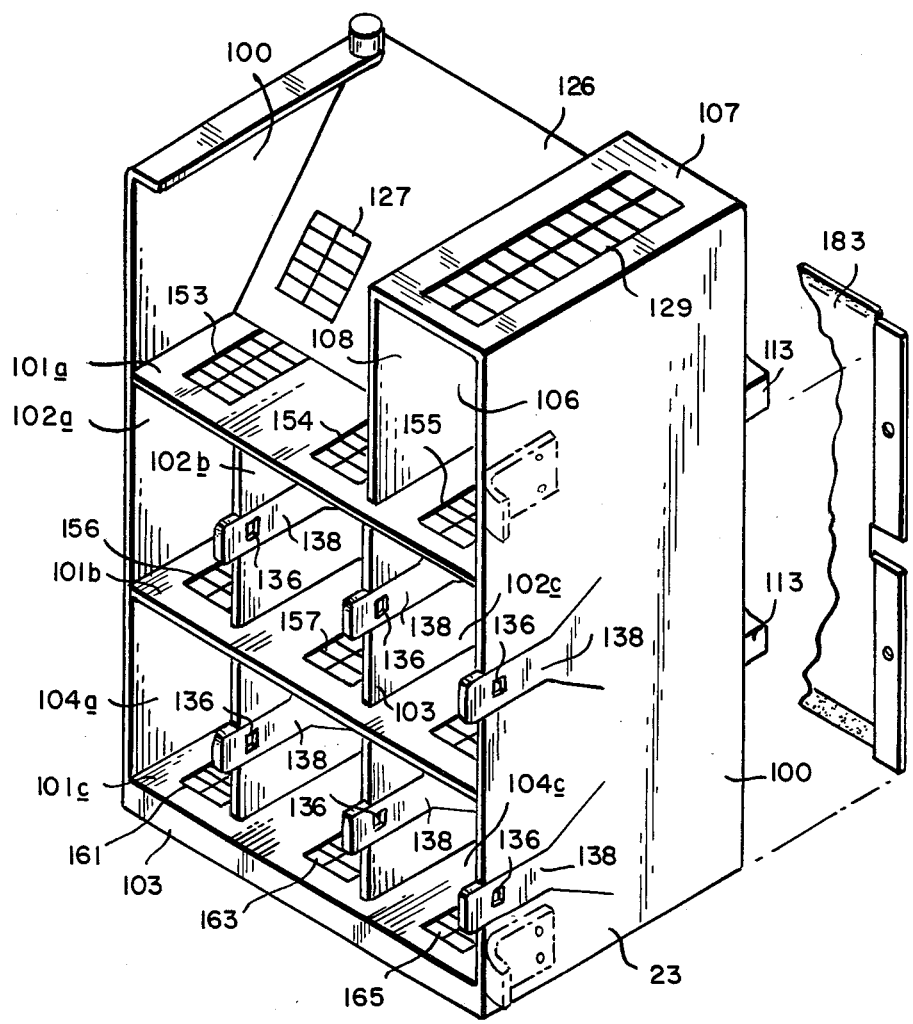

In FIG. 5, the frame 11 is shown in an exploded view as comprising the main unit 13 having a bottom plate 44 upon which a front bulkhead 45 and a rear bulkhead 46 are suitably secured and a top plate 47 mounted on the front and rear bulkheads 45 and 46. The unit 13 is supported above the base by L-shaped brackets 50. Suitable fastners, such as rivets 48 extend upwardly through apertures 49 in the base 10 and into holes 50a in the brackets 50, as seen in the cut-away portion of FIG. 5, to secure the unit 13 on the base. The bottom plate 44 is thus spaced from the base 10 to provide a plenum 51 above the base. A gasket 52, disposed in the cavity, prevents air leakage into the plenum.

The base 10 is provided with four casters 53, each mounted by rivets 54 to the base 10. The casters 53 are of a shock-absorbing type so as to minimize damage to, and disruption of, the internal components of the computer assembly upon movement of the cabinet on the casters.

Referring now to FIGS. 3a and 5, the fan 33 is removably supported from the base 10 by a conventional keyhole slot arrangement. Specifically, four keyhole slots 55 in the base 10 are sized for shoulder-screws 57 which extend from the fan 33. For installation, the fan 33 is moved upwardly to insert the screws 57 through the enlarged portion of the slots 55. The fan is then moved rearwardly along the base 10 to bring the bodies of the screws 57 into the narrower portion of the slots 55 so that the heads of the screws 57 support the fan from the base 10. A screw 59, extending through a hole 60 in the bottom plate 44, is screwed into threaded aperture 61 to retain the fan 33 in its supported position. An aperture 62 in the base 10 provides an air-flow path from the plenum 51 to the fan 33.

Referring to FIGS. 3 and 5, brackets 85, secured to the bottom plate 44, aid in locating and installing the power supplies 15 and 17 and the central processor units 19 and 21. As seen in FIG. 5, the bottom plate 44 is provided with two grates 87 (FIG.5), which are disposed beneath the power supplies 15 and 17.

As shown in FIGS. 2 and 5, the top plate 47 of the main unit 13 is provided with a grate 91 which permits air to pass into the unit through the top plate. The top plate is also provided with mounts 95 which have elastomeric inserts 97 that serve as friction clamps. The inserts 97 are sized to receive and removably hold projections 99 which extend from the top panel 7.

With reference again to FIG. 5, the front unit 14 has sides 100 and top, middle and bottom shelves 101a, 101b, and 101c, respectively, supported between the sides 100. The space between the top and middle shelves 101a and 101b is divided into compartments 102a, 102b, and 102c by partitions 103, and the space between the middle and bottom shelves 101b and 101c is divided into compartments 104a, 104b and 104c by partitions 105. Another compartment 106 is defined by one of the sides 100, a cover 107, a partition 108, and the top shelf 101a. The compartments 102a, 102b, 102c, 104a, 104b, and 104c are sized to receive the mass storage devices, such as the floppy disk drive unit 25, the fixed disk drive unit 27, and the tape drive unit 29.

The front unit 14 is pivotally positioned on the main unit 13 by a hinge which comprises, at the top, an elongated stub 109 which extends through an aperture in a bracket 110 extending from the top plate 47, and is lowered into a thru hole in the unit 14. At the bottom, the hinge comprises the lower portion of stub 109 which extends downwardly from the top of the front unit 14 into a hole 111 in the bottom plate 44. Lifting of the stub portion 109 permits the removal of the entire front unit 14 from the main structural unit 13.

The front unit 14 is thus rotatable from the open position shown in FIG. 3 to the operative position shown in FIG. 2. Bearing plates 112 composed of a suitable low friction material, such as Delrin ®, are provided on the bottom plate 44 to promote the movement of the front unit 14 over the plate 44. A compressible gasket 113, as most clearly seen in FIG. 5 is disposed between the bottom plate 44 and the unit 14 to provide an air-tight seal between them when the unit 14 is in its closed position, and yet permit the movement of the unit 14 over the bearing plates 112.

With reference to FIG. 3, the front unit 14 is held in its closed position shown in FIG. 2 by screws (not shown) which extend through apertures 114 in the front bulkhead 45 and are adapted to be threaded into brackets 115 which extend from the front unit 14.

Referring now to FIGS. 2 and 4, a retractable leg 117 has an elongated slot 118 through which a guide pin 119 secured to the unit 14 extends. A screw 120 extends from the unit 14 through the slot 118 and has a nut 121 positioned thereon. Loosening and retightening the nut 121, permits the vertical movement of the leg 117 and securing thereof in either an upper of or lower position. Thus, when the front unit 14 is in the open position, as seen in FIG. 3, the leg 117 may be used as an additional point of contact with the floor to prevent undesired tipping of the assembly. Likewise, the leg 117 may be retracted when the front unit 14 is returned to the closed position shown in FIG. 4.

As shown in FIGS. 2 and 5, the front unit 14 is provided with a baffle 126 which has two grates 127 (only one of each of the grates is seen in FIG. 2 or FIG. 5), so that air striking the baffle 126 moves both upward along the baffle and through the grates 127. A grate 129 is also provided in the cover 107 of the front unit 14.

Each of the mass storage devices is provided with a plate 130, as best seen in FIG. 3, mounted on the unit 27. The plate 130 is keyed to slide along brackets 132 provided on the shelves 101a, 101b, and 101c, as seen in FIGS. 2 and 3B. The brackets 132 are positioned so that two of the brackets extend from each of the shelves 101a, 101b, and 101c into each of the compartments 102a, 102b, 102c, 104a, 104b, and 104c, whereby two brackets extend from the top of each compartment and two brackets extend from the bottom of each compartment. The brackets 132 together with the walls of the compartment, thus, provide a track which guides the plate 130 and the mass storage device on which the plate is mounted into position within a compartment, as seen in FIG. 3B.

With further reference to FIGS. 3 and 5, each of the plates 130 is also provided with an outwardly extending stub 134. The stubs 134 are sized to extend into apertures 136, provided in each of resilient arms 138, formed in the partitions 103 and 105 and in one of the sides 100 of the front unit 14. The mass storage devices are retained in position in the compartments 102a–102c and 104a–104c. They are released for removal from the compartments by pushing the arms 138 away from the stubs 134.

As seen in FIGS. 1 and 2, apertures 139 and 140 in the front panel 1 are provided in the front panel so that users of the computer assembly have access for mounting and removing floppy disks in the floppy disk drive 25 and tapes in the tape drive 29 which are in this instance mounted in the compartments 102b and 102c. The compartment 106 (FIG. 2) in this instance is sized to receive a control unit 141 (FIGS. 1 and 3) which is mounted in the compartment 106. The control unit 141 has manual on/off switches 143 and a lock 145, that control a main power switch to control access to and use of the computer assembly.

The shelf 101a, as seen in FIG. 5, is provided with three grates 153, 154, and 155 which are positioned above the compartments 102a, 102b, and 102c, respectively. Thus, air passing through the compartment 106 may be drawn through the grate 155 and into the compartment 102c. Likewise, air passing first through the grates 127, as well air directly over the grates 153 and 154, may be drawn through the grates 153 and 154 into the compartments 102a and 102b respectively. Grates 156, 157, and 158 are positioned in the shelf 101b such that air may be drawn from the compartments 102a, 102b, and 102c into the compartments 104a, 104b, and 104c respectively. Grates 161, 163, and 165, in turn, are positioned in the shelf 101c so that air may be drawn from the compartments 104a, 104b, and 104c through the gasket 115, and then through grates 169, 171, and 173 (FIG. 3), in the bottom plate 44, when the front unit 14 is in the operative position.

With reference to FIG. 3, air passing through the grates 169, 171, and 173 is drawn through the plenum 51 and through the fan aperture 62 (FIG. 5) to the fan 33. The fan 33 expels the air a grill 175 secured to the outer housing of the fan 33. The base 10 is provided with a forward aperture 181 and raised sides to promote the exit of air from the fan 33.

The front unit 14 has a rear cover plate 183 pivotally mounted thereon which operates to prevent air escape through the rear of the unit 14, and thus encourage the movement of air through the compartments 102, 104, and 106 and toward the fan 33 along the above described air path. The cover is provided with a soft resilient foam gasket 185 to prevent air leakage.

The front bulkhead 45 has connector plate 193 mounted thereon with a plurality on connectors providing points of contact whereby, for example, the fixed disk drive 27 is connected to the plate 193 by cable 195 which extends from the drive 27 through the plate 183 and engages a plug 197 on plate 193. The plug 197 is connected to plug 199, and cable 201 which extends through an aperture in front bulkhead 45 connects plug 199 with the central processor unit 19. It will be understood that a further or alternative connector plate may be provided on the front bulkhead 45 below the plate 193, as desired. The control unit 141 is connected via cable 203 to the power supplies 15 and 17 in a known manner to turn the power supplies 15 and 17 on and off, as previously described.

Figure 6:
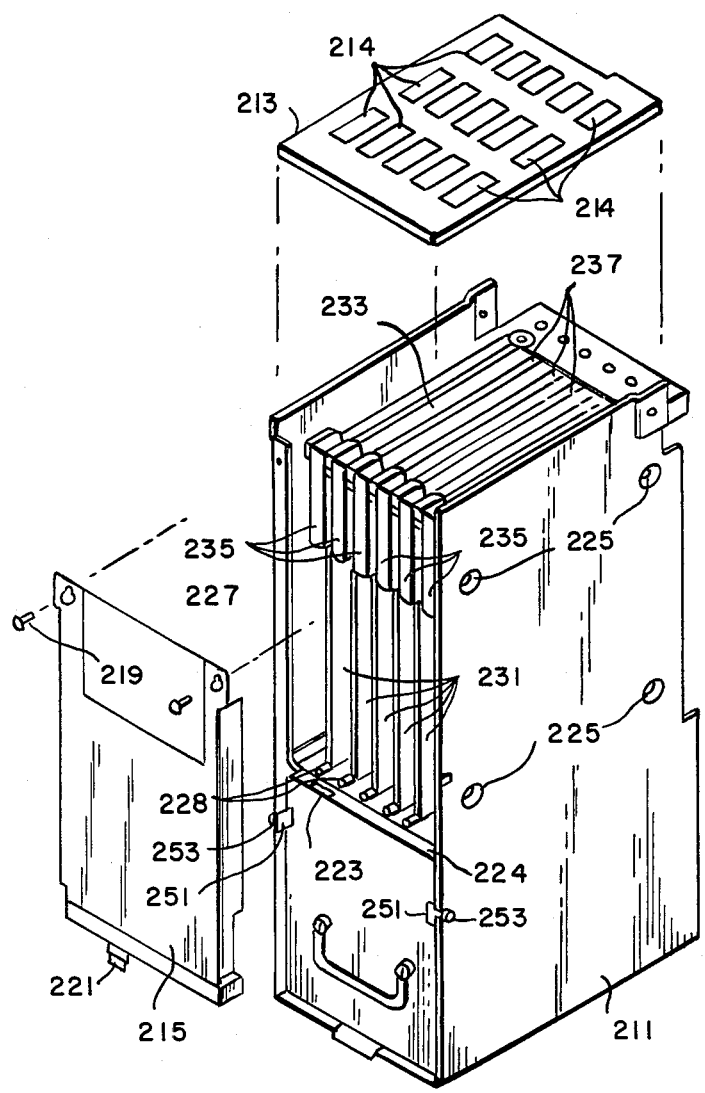
FIG. 6 is an exploded view of a unit of the inner structure, containing a central processor unit and a power supply of the computer assembly.
Figure 7:
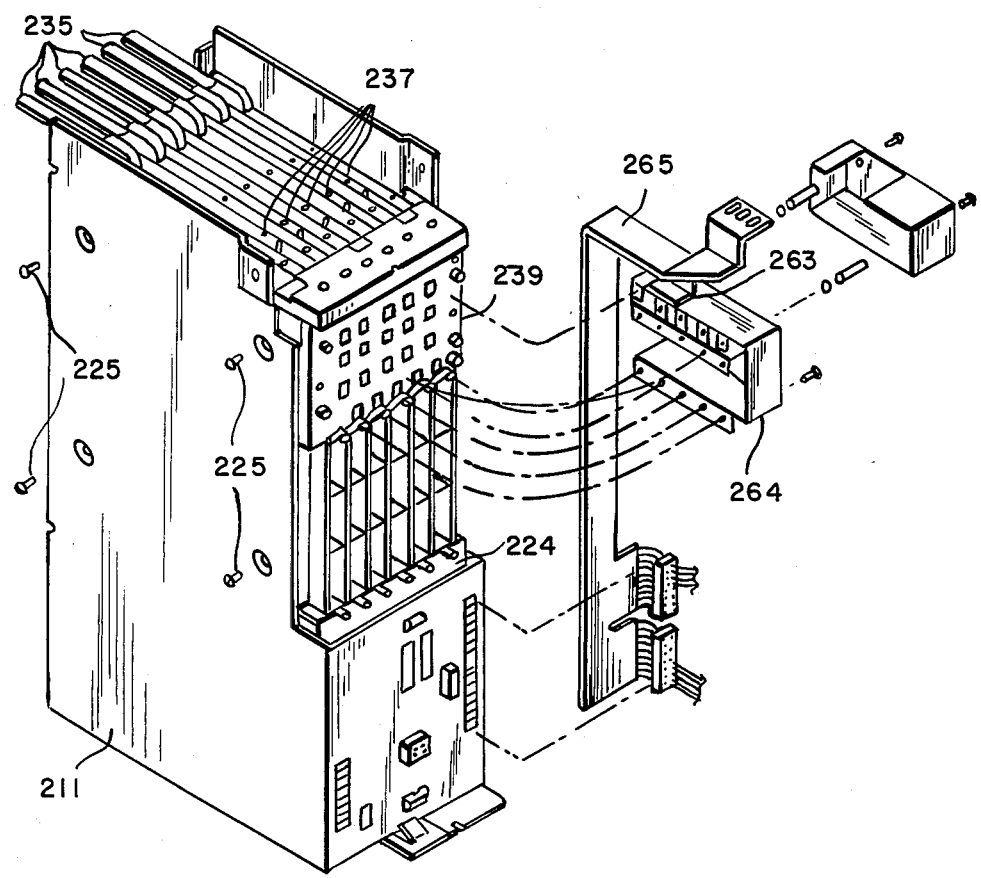
FIG. 7 is a view of the unit shown in FIG. 6 from a different vantage point.

As shown in FIGS. 6 and 7, an inner housing contains the central processor unit 19 and the power supply 15 includes a U-shaped housing member 211. A top cover 213 (FIG. 6) provided with apertures 214 for air flow into the housing. A front cover plate 215 is held in place by screws 217 threaded into tabs 219 on the member 211 and also by a downward projection 221 extending into the power supply 15 through slot 223 in a divider 224, which extends across the member 211. The projection 211 when extending into the power supply 15 contacts an interlock switch (not shown) so that removal of the plate 215 from the member 211 disconnects the power supply.

Still referring to FIGS. 6 and 7, the central processor unit 19 is positioned in the inner housing by screws 225 extending through the member 211. The unit 19 includes a card cage 227 having multiple slots 228 for printed circuit boards 231 carrying logic circuitry. The card cage 227 has a top grille 233 (FIG. 6) and a bottom grille, not shown, which permit air to pass downward from the top cover 213 through the cage and between the boards 231 therein and exit through apertures (not shown) in the divider 224.

The grille 233 is positioned above the boards 231, so that the solid portions of the grille are positioned directly above the boards 231. Thus the apertures of the grille lie over the non-occupied areas of the card cage 227. This arrangement of the boards provides a substanially uniform air flow thru the card cage 227 whether the slots 228 are occupied or not by the boards 231.

A suitable securing and connecting arrangement such as locking clips 235 which is connected to connectors (not shown) via elongated members 237. Thus when the clips 235 are in the closed position, as shown in FIG. 6, the boards 231 are connected to a back plate 239, and when the clips are in the open position, as shown in FIG. 7, the boards 231 are removable from the slots 228.

The power supply 15 is held in position in the member 211 by screws 251, threaded into brackets 251 which extend from the power supply. The power supply 15 is connected by a cable 263 to the back plane 239.

Figure 8:
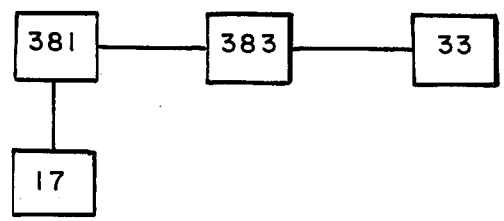
FIG. 8 is a schematic of components of the present invention.

With reference to FIGS. 4 and 8, the central processor unit 19 and the power supply 15 are cooled by the action of the fan 33. The fan 33 pulls air through the grate 91 in the top plate 47 and then through the apertures 214 in cover plate 213 into the card cage 227 through the grille 233 and between the boards 231. The grille (not shown) in the base of the card cage 227 permits the passage of this air into the power supply 15 through apertures (not shown) in the divider 224. The air exits the bottom of the power supply 15 and then passes through apertures (not shown) in the base of the U-shaped member 211. The grille arrangement in this instance is of the type disclosed in co-pending application Ser. No. 823,387, which has been assigned to the same entity as the present application. As seen in FIG. 5, the air next passes through the underlying grate 87 in the bottom plate 44 and into the plenum 51. The air is then drawn through the fan aperture 62 and into and out of the fan 33. It will be understood that in computer assemblies employing only one power supply and central processor units one of the grates 87 may be blocked off by a metal plate for example.

Now with reference to FIGS. 4 and 5, a vertical partition 281 is secured to the bottom plate 44 and the top plate 47 proximate to the rear bulkhead 46. Apertures 282 are provided in the partition 281 for various electrical cables such as cable 283 connected to central processor 19 (FIG. 3). A rear door 285 is removably supported by pintle hinges 287 and is secured in a closed position by screws 288, which correspond to threaded apertures in the rear bulkhead 46 (not shown). The door 285 is fitted with various connector plates 291 for receiving various cables such as the cable 283.

Various external devices such as printers, terminals, and the like, thus, may be connected to the central process units 19 and 21 by adaptor plugs (not shown), connected to such devices, by insertion into adaptors (not shown) on the rear face of door 285 connected to plates 291, whereby such external devices are connected to the central processor units. A wire guide plate 295 secured to the base 10 is adapted to retain wires connecting such external devices with the computer assembly. Cover plates 296 may also be provided in the door 285 to cover non-used adaptor socket apertures 297 provided in the door 285. The cover plates 296 also provide for the shielding of the enclosure to comply with FCC regulations.

Referring now to FIGS. 1, 2, and 3, the panels 1, 3, 5, 7, and 9 are positioned on the frame as shown in FIG. 1. Two sets of thread studs 331 (FIG. 2) are positioned on each side of the front unit 14. Slotted brackets 335 which extend from the panel 1 are removably retained on the pins 331 by means of knurled nuts 336. The side panels 3 and 5 are each removably suspended on the front unit 14 by means of corresponding pintle hinges 337 secured to the front unit 14 and the side panels 3 and 5.

The rear panel 9 is provided with angled slots 343 which support the panel 9 on pins 345 which extend from the side panels 3 and 5. The panel 9 is thus removable from the pins 345 by lifting and pulling the rear panel 9 away from the computer assembly. The edges of the slots 343 cooperate with the heads of the pins 345 to hold the side panels 3 and 5 in place when the rear panel is positioned on the pins 345. Removal of side panels 3 and 5 then provides access for easy removal of the front panel 1.

The internal components can thus be easily reached by removal of all or part of the external panels 1–9, as hereinafter set forth. The top panel 7 is removed by lifting the panel so that the projections 99 are removed from the mounts 95. The top panel is also provided with adjustable screws 347 which contact the front unit 14 when the top panel 7 is installed to provide support to the forward position of the top panel 7.

Referring to FIG. 4, it will be recognized that by removal of the rear panel 9, access is gained to the rear door 285, so that connecting cables from various external devices may be installed, removed or rearranged. Removal of the rear panel 9 also permits the swinging open of the rear door 285 on the hinges 287 so that removal, installation and rearrangement of the cables such as the cable 293 on the connectors 294 may be accomplished.

Removal of the side panels 3 and 5 in the manner described permits ready access to the central processor units 19 and 21 and the power supplies 15 and 17, as well as the cables which lead from the power supplies 15 and 17 and central processor units 19 and 21 to various other components of the computer assembly, such as cables 201, 283 and 265. Removal of the side panels 3 and 5 also permits the removal of the front panel 1 and the loosening of the screws (not shown) which hold the front unit 14 in its closed position proximate to the front bulkhead 77.

Each of the inner shaped housings (FIGS. 6 and 7) is removable from the computer assembly by loosening a wing nut 351 (FIG. 3) which fastens a bracket 353 extending from the U-shaped housing 211. This permits removal of the power supply and the central processor unit as a group, once the cables connecting them to other components have been removed.

Much of each central processor unit is serviceable without removing it from the computer assembly. For example, removal of the cover plate 215 provides access to the circuit boards 231, which are removed and installed as previously described. The power supply is also separately removable by removing screws 253, the plate 217 and the cables leading from the power supply to other components, a handle 354 is provided on the power supply to assist in the removal of the power supply 15. The fan 33 can be removed and installed when the side panel 5 is removed, as screw 59 is accessible, so that the fan 33 may be removed from the base 10, as described above.

The opening of the front unit 14 when the side panels 3 and 5 are removed permits access to the cables leading from the central processor units and power supplies to the connector panel 193 and from the connector panel to the mass storage devices. Thus, these cables attached to the connector 193 may be installed, replaced or rearranged and the connector may also be serviced. It will be recognized that this arrangement of the swinging front unit 14, permits an otherwise limited area to become sufficiently large to permit ease of service. The mass storage devices disposed in the front unit 14 may also receive attention by the swinging open of the plate 183 whereby access to replace and install cables from the connector panel 193 to the mass storage devices is achieved. The removal of the front panel 1, as previously described permits the installation and removal of the mass storage devices 25, 27, and 29 and the control unit 141, as previously described.

Referring now to FIGS. 1 and 2, the action of fan 33 acts to draw air into the computer assembly through a gap 361 between the top panel 7, and the front, side and rear panels 1, 3, 5, and 9, and also through a vent 363 in the front panel 1. The air entering the computer assembly through the vent 363 is drawn by the action of the fan 33 in part to grate 153 and 154, both directly and through grate 127. The remaining air entering through the vent 363 is directed up by the baffle 126 and is then drawn through the grates 91 and 129 along with the air drawn in through the gap 361 above the vertical panels 1, 3, 5 and 9. The air entering grates 91, 129, 153, and 154 then cools the components of the computer assembly, by flowing along the paths previously described. The air entering the fan 33 is expelled through the grille 175 which then exits from the cabinet structure radially through vented skirts 371, 373, and 375, provided in the front and side panels 1, 3, and 5 respectively.

It will be understood that the cabinet is provided with means for grounding the inner housing structure to minimize radio frequency disturbance. For instance the side panels 3 and 5 are provided with metal plates 377

(FIG. 2) which contact the front unit 14 and the main unit 13 in a known manner. It will also be understood that the metal plates 377 may be removably mounted to the main unit 13 in a known manner rather then on the side panels 3 and 5 to provide adequate RF shielding.

It will be appreciated, that by the use of a variable speed fan, such as a fan driven by a servo motor and a thermal emulator which emulates the temperature of the most critical components of the central processor units and which is connected to a fan controller, the optimum cooling of the assembly can be achieved. In this instance, as shown in FIG. 8, a thermal emulator 381 (FIG. 4) is positioned in the air path in the power supply 17. The emulator 381 is a thermal sensitive resistor of the type disclosed in co-pending application Ser. No. 854,137, which has been assigned to the same entity as the present application. As seen in FIG. 8, the thermal emulator is connected to the power supply 17 and a fan controller 383 which controls the speed of the fan 33. Thus, as the emulator becomes more resistive, the controller 383 causes an increase in the speed of the fan, thereby providing greater cooling to the components of the assembly.

Further, it has been found that the data storage and access devices positioned in the front unit do not require as great a volume of the cooling air flow as required by the central processor unit. Thus, by adjusting the the shape of the gasket 73 such that a nozzle-like necking 385 is formed in the gasket between the fan aperture 75 and the grates 169, 171, and 173, a smaller air flow through the mass storage devices than through the central processor units and power supplies for various fan speeds of the fan is thereby achieved. Thus, this necking 385 functions as a fixed regulating valve to limit the air flow through the mass storage devices relative to the central processor units and the power supplies.

Thus, it will be understood and appreciated by those skilled in the art that the present cabinet structure for computer assemblies is relatively small in structure, yet, it provides for ease of assembly of both the the cabinet and the computer assembly housed therein, as well as ease of servicing of the various components of the computer assembly. The cabinet also provides the adequate cooling of the components of the computer assembly.

What is claimed as new and desired to be secured by Letters Patent of the United States is:

1. A cabinet adapted for housing a computer assembly in a relatively compact manner, wherein said assembly is of a type having a power supply, a central processor unit, and mass storage means, comprising:
   a base;
   a frame secured to said base;
   outer panels removably positioned on said frame;
   means for mounting said power supply on said frame whereby said power supply is carried by said frame;
   means for mounting said central processor unit on said frame, whereby said central processor unit is carried by said frame;
   means for mounting said mass access and storage means on said frame, whereby said means are carried by said frame; and
   means for cooling said components of said assembly, such that the central processor unit, the power supply, and the mass storage means are provided adequate cooling, wherein said cooling means include a fan mounted on said base and air paths positioned in said frame whereby air for cooling is brought through and over said central processor unit, the power supply, and the mass storage means by said fan, thereby cooling these components of the computer assembly, wherein said frame includes a front unit pivotally positioned thereon, said front unit swingable from a closed position, where said front unit is in line with the rest of said frame, and an open position, where said front unit is swung away from the rest of said frame, and said mounting means for mounting said mass storage means and said mass storage means are disposed in said front unit, whereby the rear portions of said mass storage means are accessible when said front unit in its open position.

2. A cabinet according to claim 1 wherein said mounting means for mounting said mass storage means include a compartment disposed in said front unit having a track provided therein, whereby a plate secured to said mass storage means is guided by said track to position said mass storage means in said front unit.

3. A cabinet according to claim 2 wherein said mounting means for mounting said mass storage means further include a resilient arm, having an aperture disposed therein, provided in said compartment of said front unit, whereby a tab on said plate secured to said mass storage means extends through said aperture, when said mass storage means are positioned in said front unit, thereby holding said mass storage means in position.

4. A cabinet according to claim 2 wherein said mass storage means include disk drives, said compartment in said front unit is several individual compartments, each of said compartments provided with one of said tracks and one of said arms, and each of said tracks include two sets of raised portions extending from opposite walls in each of said compartments whereby said raised portions, said opposite walls and a third wall of each of said compartments cooperate to form each of said tracks in which each of said plates are positionable.

5. A cabinet according to claim 1, wherein one of said air paths extends through said front unit to thereby provide air for cooling to said mass storage means.

6. A cabinet according to claim 5, wherein said front unit has top, bottom, and side panels which define an inner compartment in said front unit, said inner compartment having said mounting means for said mass storage means positioned therein, whereby the mass storage means are positioned in said front unit.

7. A cabinet according to claim 6, wherein said top and bottom panels are provided with grates whereby said air for cooling can pass through said front unit.

8. A cabinet according to claim 7, wherein said inner compartment is further divided by vertical partitions and horizontal shelves to thereby define multiple compartments, said multiple compartments having said mounting means for said mass storage means positioned therein, and said shelves having grates disposed therein, whereby said air for cooling can pass through said compartments and then through said grates in the bottom of said front unit.

9. A cabinet according to claim 8, further comprising a grate in said frame positioned below said front unit whereby said air for cooling passes from said front unit and through said grate in said frame, a plenum defined by said frame and said base, and a fan aperture in said base disposed above said frame wherein said air for cooling entering through said grate in said frame passes through said plenum and then through said fan aperture and into said fan.

10. A cabinet according to claim 9, further comprising a gasket positioned between said frame and said base to further define said plenum.

11. A cabinet according to claim 10, wherein said gasket is provided with a narrowed portion to restrict the air flow through said front unit relative to other of said air paths.

12. A cabinet according to claim 1 wherein said means for mounting said power supply and said means for mounting said central processor unit includes an inner housing removably secured to said frame and whereby said power supply and central processor unit are positionable in said inner housing.

13. A cabinet according to claim 12, wherein said housing includes a U-shaped structure, having an aperture in the bottom of said structure, to which said central processor unit and said power supply are secured, a cover with apertures secured to the top of said structure, a divider having apertures therein positioned between the walls of said structure, and a front plate mounted on said structure, whereby an air path is defined through said housing through said cover, through apertures provided in said central processing unit, through said divider, through apertures provided in said power supply and exiting through said aperture in said structure.

14. A cabinet according to claim 13, wherein said front plate is removable from said housing whereby access is provided to components of said central processor unit such that said components can be removed therefrom or installed therein.

15. A cabinet according to claim 14, wherein said front plate is provided with a tab which extends through a slot in said divider to contact an interlock switch in said power supply, such that removal of said plate from said inner housing disconnects said power supply.

16. A cabinet according to claim 15 further comprising a grate positioned in said frame below said inner housing so that air passing through said aperture in said U-shaped housing passes through said grate in said frame, a plenum provided between said base and said frame, and a fan aperture positioned above said fan in said base, such that air passing through said grate in said frame passes enters said plenum and exits said fan aperture to said fan.

17. A cabinet according to claim 12 wherein said power supply is secured to a bracket on said U-shaped stucture by a screw, whereby the power supply is removed from the housing.

18. A cabinet according to claim 1 wherein said frame includes a main unit, having a base plate, front and rear bulkheads, and a top plate, and a front unit pivotally mounted on said main unit.

19. A cabinet according to claim 18 further comprising a fan aperture positioned in said base above said fan, a plenum disposed between said base plate and said base, and grates positioned in said base plate, wherein said air paths include a first air path through said front unit and a second air path through said main unit such that said air paths continue through said grates in said base plate into said plenum and then through said fan aperture to said fan.

20. A cabinet according to claim 19 wherein said front unit has a top surface with apertures positioned therein and a bottom surface with apertures postioned therein such that said first air path passes through said apertures in said top and bottom surfaces and then enters through said grates in said base plate.

21. A cabinet according to claim 20, wherein said front unit has compartments, for receiving said mass storage means, with said mounting means for mounting said mass storage means, and said compartments are provided with grates therein whereby said air for cooling is provided through said compartments along said first air path to thereby cool said mass storage means positioned in said compartments.

22. A cabinet according to claim 21, wherein said air path in said front unit inludes grates disposed in said front unit cooperating with said detents for positioning said means in said unit in an operative position and said tab extends into said aperture to hold said means in the operative position, whereby said means is easily installable and removable from said unit.

23. A cabinet adapted for housing a computer assembly in a relatively compact manner, wherein said assembly is of a type having a power supply, a central processor unit, and mass storage means, comprising:
a base;
a frame secured to said base;
said frame having a main structural unit, a inner housing positioned in said main structural unit and a front unit pivotally mounted on said main structural unit;
outer panels;
said outer panels include a front panel secured to said front unit, side panels pivotally mounted on the front unit, a rear panel mounted between said side panels, and a top panel mounted on said main structural unit;
means for mounting said power supply in said inner housing, whereby said power supply is carried by said frame;
means for mounting said central processor unit in said inner housing, whereby said central processor unit is carried by said frame;
means for mounting said mass storage means in said front unit, whereby said means are carried by said frame; and
means for cooling said components of said assembly, such that the central processor unit, the power supply, and the mass storage means are provided adequate cooling, wherein said cooling means include a fan mounted on said base and air paths positioned in said frame whereby air for cooling is brought through and over said central processor unit, the power supply, and the mass storage means by said fan, thereby cooling these components of the computer assembly.

24. A cabinet according to claim 23, further comprising apertures between said outer panels whereby said air for cooling enters the inner portion of said cabinet.

25. A cabinet according to claim 24, wherein said main structural unit has a bottom plate, a front bulkhead, a rear bulkhead, and a top plate, said bottom plate has grates positioned below said front unit and said inner housing, said top plate has a grate positioned above said inner housing, and a plenum defined between said main structural unit and said base.

26. A cabinet according to claim 25, further comprising a fan aperture positioned in said base above said fan, so that the air in said plenum is pulled by said fan through said fan aperture into said fan, and vented skirts positioned in said front and side panels, whereby air expelled by said fan exits the cabinet.

27. A cabinet according to claim 26, wherein said front unit has two sides, horizontal shelves disposed between said sides, forming compartments in said front unit which receive said mass storage means, and said shelves having grates positioned therein whereby said air for cooling is provided along one of said air paths to said mass storage means and then passes from said front unit into said plenum through said grates positioned below said front unit.

28. A cabinet according to claim 27, further comprising a vent positioned in said front panel whereby further air for cooling enters the inner portion of said cabinet.

29. A cabinet according to claim 27, wherein said front panel is provided with an air baffle positioned behind said vent to direct a portion of said air for cooling entering through said vent upward towards said top panel.

30. A cabinet according to claim 26, wherein said air for cooling passing through the grate in the top plate is directed by the fan into the inner housing through apertures provided therein to thereby cool the central processor unit and the power supply positioned within said inner housing.

31. A cabinet according to claim 30, wherein said inner housing includes a U-shaped structure, a top grille, and a front plate and said U-shaped housing has an apertures in the bottom of said housing so that air passing through said housing passes through said apertures into said plenum through said grate positioned below said inner housing.

32. A cabinet according to claim 31 wherein said front panel is removable to provide access to said central processor unit whereby components thereof can be removed and installed.

33. A cabinet according to claim 32 wherein said plenum is provided with a narrowed portion positioned between said fan aperture and said grates in said bottom plate positioned below said front unit to thereby limit the air flow through the air paths in said front unit relative to the air flow through the air paths in said inner housing.

34. A cabinet adapted for housing a computer assembly in a relatively compact manner, wherein said assembly is of a type having a power supply, a central processor unit, and mass storage means, comprising:
a base;
a frame secured to said base;
outer panels removably positioned on said frame;
means for mounting said power supply on said frame whereby said power supply is carried by said frame;
means for mounting said central processor unit on said frame, whereby said central processor unit is carried by said frame;
means for mounting said mass storage means on said frame, whereby said mass storage means are carried by said frame;
means for cooling said central processor unit, such that the central processor unit, the power supply, and the mass storage means are provided adequate cooling, wherein said cooling means include a fan mounted on said base and air paths positioned in said frame whereby air for cooling is brought through and over said central processor unit, the power supply, and the mass storage means by said fan, thereby cooling these components of the computer assembly; and
means for varying the rate of flow of the air for cooling in a predetermined manner.

35. A cabinet according to claim 34, wherein said means for varying includes a thermal emulator.

36. A cabinet according to claim 35, wherein said means for varying further includes a fan controller and said fan which is of a variable speed type, whereby said fan controller varies the speed of the fan in a predetermined manner.

37. A cabinet according to claim 36, wherein said thermal emulator is positioned in one of said air paths and is connected to said fan controller, whereby significant changes in the thermal state of said thermal emulator causes the speed of said fan to be altered in the predetermined manner, thus providing said means for varying the rate of flow of said air for cooling.

38. A cabinet according to claim 35, wherein said thermal emulator emulates a component of the central processor unit and is positioned in the air path in which said component is positioned.

39. A cabinet according to claim 35, wheein said thermal emulator emulates a component of the central processor unit and is positioned in the power supply.

40. A cabinet adapted for housing a computer assembly in a relatively compact manner, wherein said assembly is of a type having a power supply, a central processor unit, and mass storage means, comprising:
a base;
a frame secured to said base;
said frame having a main structural unit, a inner housing positioned on said structural unit and a front unit pivotally mounted on said main structural unit;
said main sturctural unit having a bottom plate positioned on said base with a plenum defined between said base and said plate, a front bulkhead positioned proximate to said front unit and secured to said bottom plate, a rear bulkhead secured to said bottom plate, and a top plate secured to said front and rear bulkheads;
outer panels removably positioned on said frame;
said outer panels include a front panel mounted on said front unit, side panels pivotally mounted on said front panel, a rear panel disposed between said side panels, and a top panel mounted on said top plate;
means for mounting said power supply in said inner housing, whereby said power supply is carried by said frame;
means for mounting said central processor unit in said inner housing, whereby said central processor unit is carried by said frame;
means for mounting said mass storage means in said front unit, whereby said mass storage means are carried by said frame; and
means for cooling said computer assembly, such that the central processor unit, the power supply, and the mass storage means are provided adequate cooling, wherein said cooling means include a fan mounted on said base and air paths positioned in said frame whereby air for cooling is brought through and over said central processor unit, the power supply, and the mass storage means by said fan, thereby cooling these components of the computer assembly.

41. A cabinet according to claim 40, wherein said front unit has sides, top, middle and bottom shelves, a compartment positioned above said top shelf, a baffle positioned above said top shelf, partitions disposed between said top and middle shelves and said middle and bottom shelves providing further compartments in said front unit, such that said compartments are adapted for positioning components of the computer assembly therein.

42. A cabinet according to claim 41, wherein said mass storage mounting means are disposed is at least some of said compartments whereby said mass storage means are positionable in some of said compartments.

43. A cabinet according to claim 42 wherein appertures are provided in both the top and the bottom of each of said compartments having mass storage means positioned therein whereby said air for cooling passes through said compartments and over components positioned therein.

44. A cabinet according to claim 43, further comprising apertures in said base plate positioned below said front unit whereby said cooling air after passing through said front unit passes through said apertures in said base plate into said plenum.

45. A cabinet according to claim 40, further comprising apertures in said base plate positioned below said inner housing, apertures in said top plate positioned above said inner housing, a cover secured to the top of inner housing with aperture as provided therein, and a grate provided in the bottom of the inner housing, such that the cooling air is drawn by the fan through the apertures in said top plate and into the housing through the apertures provided in said cover, and exits from said housing to said fan through the apertures in said base plate positioned below said inner housing and then through said plenum and said fan aperture.

* * * * *